United States Patent [19]

Vu et al.

[11] Patent Number: 4,581,520

[45] Date of Patent: Apr. 8, 1986

[54] HEAT TREATMENT MACHINE FOR SEMICONDUCTORS

[76] Inventors: Duy-Phach Vu, 5 rue de l'Oisans; Michel Haond, 9 rue des Lilas, both of 38240 Meylan, France

[21] Appl. No.: 529,108

[22] Filed: Sep. 2, 1983

[30] Foreign Application Priority Data

Sep. 7, 1982 [FR] France ................ 82 15182

[51] Int. Cl.$^4$ .......................................... H05B 1/00
[52] U.S. Cl. .................. 219/349; 219/354; 219/405; 219/411
[58] Field of Search ............. 219/349, 354, 405, 411, 219/348, 85 BA, 85 BM; 250/492.2, 492.1, 493.1

[56] References Cited

U.S. PATENT DOCUMENTS

| | | | |
|---|---|---|---|
| 3,543,717 | 12/1970 | Adachi | 250/492.1 |
| 3,648,048 | 3/1972 | Cahan | 250/492.2 |
| 3,692,572 | 9/1972 | Strehlow | 219/349 |
| 3,710,069 | 1/1973 | Papadopoulos | 219/85 BA |
| 3,742,181 | 6/1973 | Costello | 219/349 |
| 3,761,677 | 9/1973 | Mizutani | 219/354 |
| 3,790,054 | 2/1974 | Dahlberg | 219/354 |
| 3,956,635 | 5/1976 | Chang | 250/492.2 |
| 4,338,508 | 7/1982 | Jones | 250/492.2 |

FOREIGN PATENT DOCUMENTS

| | | |
|---|---|---|
| 0021087 | 1/1981 | European Pat. Off. |
| 2917353 | 3/1981 | Fed. Rep. of Germany |
| 53-10937 | 4/1978 | Japan ................ 219/349 |
| 586425 | 3/1947 | United Kingdom ........ 219/349 |
| 938699 | 10/1963 | United Kingdom ........ 219/349 |
| 432216 | 9/1975 | U.S.S.R. ................ 219/349 |

OTHER PUBLICATIONS

Von Gutfeld, R. J., "Crystallization of Silicon . . . ", IBM Tech. Disc. Bull., vol. 19, No. 10, Mar. 1977, pp. 3955–3956.

Primary Examiner—C. L. Albritton
Assistant Examiner—Teresa J. Walberg
Attorney, Agent, or Firm—Michael N. Meller

[57] ABSTRACT

A heat treatment machine for heat-treating semiconductor wafers, each wafer having two faces. A first lamp is arranged to heat a first spot of first diameter on one face of the wafer and a second lamp is arranged to heat a second spot of second diameter on the other face of the wafer, both by reflection of emitted light off a focusing reflector. The lamps are moved in tandem such that the first spot travels along an Archimedes spiral relative to the center of the stationary wafer. The centers of the spots coincide, and the second diameter is greater than the first diameter.

11 Claims, 5 Drawing Figures

HEAT TREATMENT MACHINE FOR SEMICONDUCTORS

BACKGROUND OF THE INVENTION

The present invention relates to a heat treatment machine for semiconductors. It is used in the annealing of semiconductor wafers and also in the recrystallization of amorphous or polycrystalline silicon on an insulant.

One of the essential operations in the production of integrated circuits is the doping of a semiconductor by electron acceptor or donor atoms. This operation can be carried out by ion implantation, particularly in the case of thin layer circuits. However, as ion implantation leads to the destruction of the crystalline structure of the semiconductor over a thickness of a few thousand Angströms, it is necessary to reconstruct the crystal lattice in order to electrically activate the atoms of the implanted impurity. This reconstruction is obtained by annealing, which consists of heating the semiconductor to a high temperature, normally between 500° and 1,000° C.

Different annealing means are known, namely thermodiffusion furnaces or coherent light sources (lasers), as well as electron beams and graphite sheets heated by the Joule effect.

Furnace annealing has been used for many years in the semiconductor industry, but it is not really suitable for the new concepts of integrated circuits, where the main objective is to achieve a very high integration density, whilst reducing the dimensions of the component. By a diffusion mechanism furnace annealing, which requires 15 to 30 minutes at 500° to 1100° C., leads to a spreading out of impurities in the three dimensions of the semiconductor.

In order to retain the doping profile in the implanted areas, it is necessary to use faster annealing methods, those employing lasers or electron beams apparently being more suitable in this respect. However, the corresponding installations are complex and costly and consume a large amount of energy.

SUMMARY OF THE INVENTION

The object of the invention is to supply a less costly and simpler treatment machine than the prior art machines, whilst making it possible to rapidly increase the treated semiconductor temperature, with a reduced energy consumption.

According to the invention these objects are achieved by the use of two lamps arranged on either side of the semiconductor wafer to be treated. One of these lamps emits radiation focused onto the surface to be treated, thus supplying a high energy density. The other lamp emits radiation which, on the opposite surface of the wafer, leads to a spot concentric to that of the focal spot of the surface to be treated, having larger dimensions and a low gradient energy distribution.

The function of the second lamp is to preheat the treated regions through the semiconductor wafer, in order to facilitate annealing, whilst reducing the heat gradient in the wafer. This gradient could give rise to the appearance of slip lines and dislocations in the semiconductor. The function of the first lamp is to supply the energy complement for locally carrying out the desired heat treatment.

The machine according to the invention can be used not only for annealing, but also for recrystallization of semiconductors. In the latter case the second lamp is regulated to emit slightly focused or non-focused radiation, so that almost the entire plate is preheated.

BRIEF DESCRIPTION OF THE DRAWINGS

The invention is described in greater detail hereinafter relative to non-limitative embodiments and with reference to the attached drawings, wherein.

DETAILED DESCRIPTION OF THE PREFERRED EMBODIMENTS

Like any heat treatment machine for semiconductor wafers, that according to the invention comprises firstly means for locally heating an area of the wafer and second means for displacing this locally heated area and scanning the complete wafer. The invention is characterized by the structure of the first means and to a subsidiary extent by that of the second means.

Figure 1:
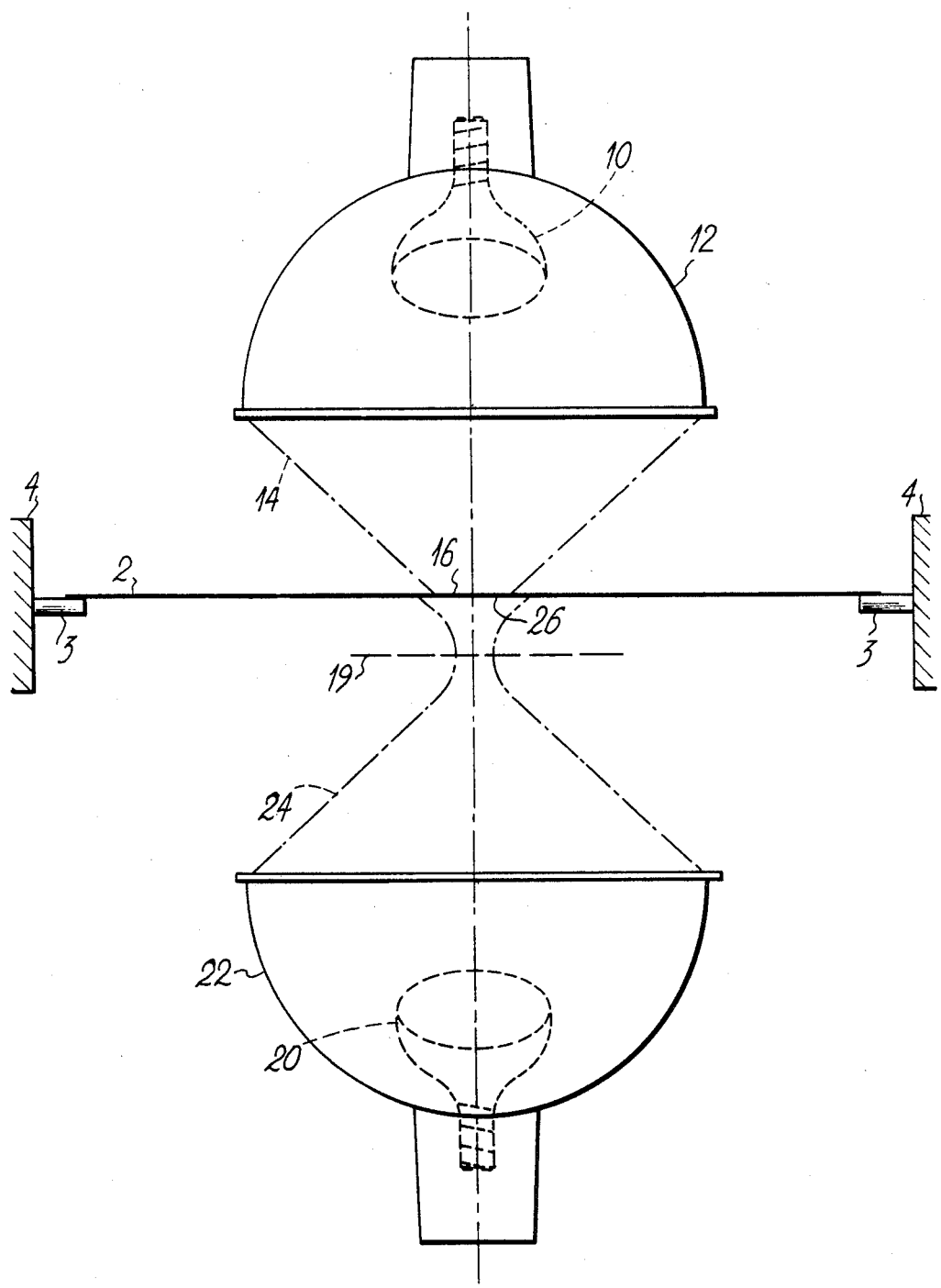
FIG. 1 shows the heating means used in a machine according to the invention.
Figure 2:
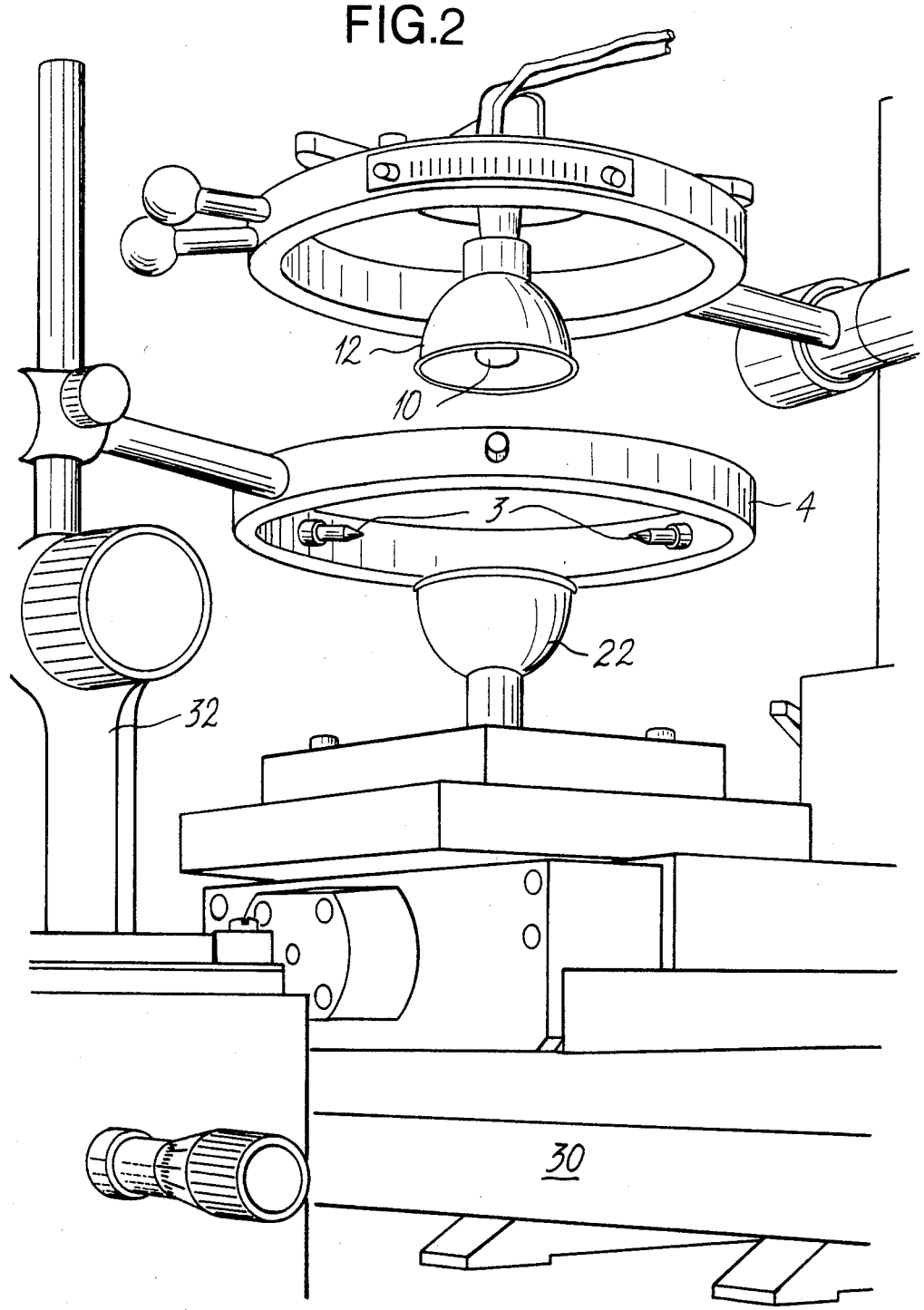
FIG. 2 is a general view of a machine according to the invention in a variant where the wafer support is fixed.

According to the embodiment shown in FIGS. 1 and 2, a semiconductor wafer 2 rests on insulating pins 3 (e.g. made of a ceramic material), which are joined to a ring-shaped support 4. The heating means are constituted by:

- a first lamp 10, placed above the wafer 2 and provided with a focusing reflector 12, this first lamp emitting a first radiation 14 directed towards the upper surface of wafer 2, which is that to be treated, this radiation being focused by the reflector in order to obtain a focal spot 16 having a certain diameter;
- a second lamp 20 placed beneath the wafer 2 and which emits a second radiation 24 directed at the lower surface of the wafer, where it forms a second spot 26 having a larger diameter than that of the focal spot 16.

Preferably in the application to annealing, the second lamp 20 is provided with a reflector, 22, identical to relector 12, but focusing the second radiation 24 on a plane 19 which is slightly displaced relative to the lower surface of the wafer 2. Thus, the second lamp fulfils the aforementioned function.

As can be seen with respect to FIG. 2, the means for displacing the heated area for scanning the complete wafer are constituted by means for displacing the two lamps, whilst the wafer remains fixed. In this case, the lamps are integral with the translation table 30 of type x—y, controlled by two (not shown) stepping motors, actuated by signals coming from an appropriate control circuit. The wafer is held by its support 4, which is integral with a fixed leg 32.

Figure 3:
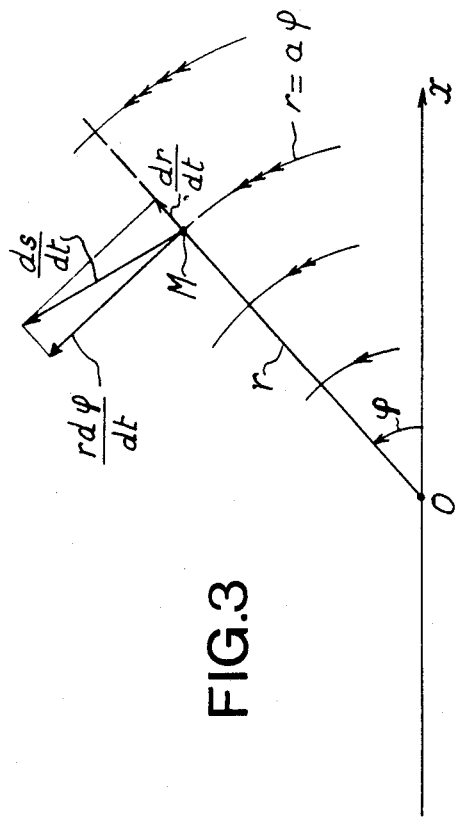
FIG. 3 shows the reference used for defining a spiral scanning at uniform speed.

Advantageously the scanning means are in an original form. They are able to perform scanning in the form of an Archimedes spiral, for which the polar coordinates r and $\phi$ of the center of the first spot with respect to the center of the wafer satisfy relation $r = a\phi$, in which a is a constant. Moreover, the time evolution of the polar angle $\phi$ is of form $b\sqrt{t}$, in which b is a constant and t is the time. The interest of the special scanning is that the linear velocity ($v=ds/dt$) is substantially constant at any point of the spiral. Thus, with the notations defined in FIG. 3, we obtain:

$$r = a\phi$$

and $$\psi = b\sqrt{t}$$

thus $$r = a \cdot b \sqrt{t}$$

The radial ($v_r$) and tangential ($v_t$) components of the velocity are written:

$$v_r = \frac{dr}{dt} = \frac{a \cdot b}{2} \cdot \sqrt{\frac{1}{t}}$$

$$v_t = r\frac{d\psi}{dt} = a \cdot b \cdot \sqrt{t} \cdot b \cdot \frac{1}{2t} = \frac{a \cdot b^2}{2}$$

$v_t$ is consequently independent of the time.

With the linear velocities conventionally used for annealing (a few mm/s), the component $v_r$ is rapidly negligible compared with $v_t$, so that:

$$v = (v_t^2 + v_r^2)^{\frac{1}{2}} \approx v_t$$

Such an Archimedes spiral movement at a constant linear velocity can be obtained by means of two stepping motors, controlled by a computer and acting on a translation table in x—y coordinates. This has a double advantage on the one hand, it leads to equidistant arms, which is necessary in order to uniformly scan the complete wafer. On the other hand, it makes it unnecessary to have a velocity which increases on reaching the periphery of the wafer, which would be the case with a linear angular law as a function of time.

Apart from the original arrangement described hereinbefore, means can be provided to ensure that the temperature of the wafer in the focal area is kept constant. These means comprise an optical pyrometer arranged in a feedback loop acting on the power supply for the lamp.

Temperature control can be useful if, as the spot approaches the edges of the installation, there is a heat reflection effect.

The machine described hereinbefore has been realized under the conditions to be defined hereinafter. Halogen lamps with an incorporated reflector and of 150 W each, marketed by OSRAM (ref. 64635) have been used. Annealing in ambient air with a laminar glow has been carried out with the following values for parameters a and b:

a = 1.27 mm/radian b = 2.17 rad/s$^{-\frac{1}{2}}$

For these values, the distance between two consecutive annealed lines is 8 mm and the linear velocity is 3 mm/s. The temperature is kept at 1000° C. The annealing of a 10 cm wafer lasts 5 minutes.

Silicon wafers of 10-cm diameter have been implanted under the following conditions: arsenic:

$5 \times 10^{14}$ cm$^{-2}$ at 50 keV $5 \times 10^{14}$ cm$^{-2}$ at 100 keV phosphorus: triple implantation:

$8 \times 10^{14}$ cm$^{-2}$ at 100 keV $+6 \times 10^{14}$ cm$^{-2}$ at 80 keV $+4 \times 10^{14}$ cm$^{-2}$ at 50 keV The characterization of the wafers obtained has been obtained by different methods:
  by measuring the resistance of the layer: this measurement has made it possible to reveal a complete activation of the impurity atoms and an excellent uniformity along a diameter (standard deviation 3.5%);
  by measuring the profile of the impurity as a function of the distance from the surface, this measurement has made it possible to confirm that the annealing carried out does not modify the profile of the doping agents resulting from the implantation;
  by planeity measurements using a Fizeau interferometer, no appreciable fogging was revealed.

Such results represent an important advantage of the machine according to the invention. Thus, to obtain a total activation, the wafer must be annealed for at least 30 minutes in a furnace at 1000° C. However, after such a time, it is found that the profile of the impurities has changed and that there has been very considerable diffusion of the doping agents (several hundred Angströms for arsenic-implanted layers at $5 \times 10^{14}$ cm$^{-2}$ and at 100 keV). In connection with this parasitic diffusion phenomenon, reference can be made to the article of A. Gat, published in the journal "IEEE Electron Device Letters", vol. EDL-2, no. 4, April 1981, pp. 85–87.

It is possible to extend the principle of the machine described hereinbefore to a machine able to treat a complete batch of wafers. For this purpose it is merely necessary to increase the number of pairs of lamps and to provide a wafer support having several cavities, each of which receives a single wafer. Such a support can be given a spiral movement at a uniform velocity. The annealing of 10-cm-diameter wafer takes place in 5 minutes, so that with 10 cavities it is possible to treat 120 wafers in an hour, which is better than that achieved with diffusion furnaces, which can only treat 100 wafers in an hour.

Figure 4:
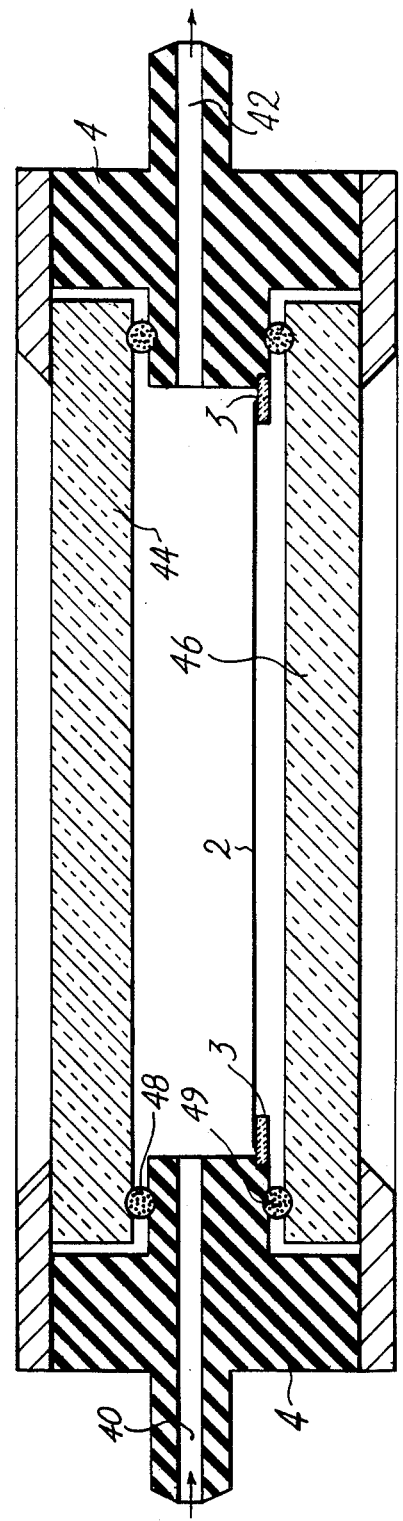
FIG. 4 shows in section, a sample holder for annealing under a controlled atmosphere.

The machine according to the invention can comprise a wafer support permitting a treatment under a controlled atmosphere and such a support is illustrated in FIG. 4. It comprises an insulating ring 4 with insulating pins 3 (e.g. made of a ceramic material), supporting the wafer 2. It also comprises a first gas supply duct 40 and a second gas discharge duct 42, both these ducts traversing the ring in diametrically opposite areas, Two transparent portholes 44, 46 are arranged in the ring, on either side of the wafer, whilst joints 48, 49 ensure the necessary sealing.

Such a structure makes it possible to work under vacuum or a controlled atmosphere. It permits the production of silicides. It permits oxidation operation (dry or wet oxygen, for thin or thick oxides).

Moreover, the machine according to the invention has a further application in silicon technology on an insulant, by permitting the recrystallization of semiconductors, particularly amorphous or polycrystalline silicon deposited on an insulating substrate. A large amount of research has been carried out on this technology over the last few years with the aim of providing stacks of alternating monocrystalline and insulating layers. Such structures make it possible to increase the integration density of circuits.

The main difficulty of this procedure is the production of a monocrystalline substrate from an amorphous or polycrystalline layer deposited on an insulant (typically an oxide or nitride supported by a monocrystalline silicon wafer). Moreover, bearing in mind the existing possibilities of silicon technology, it is essential that the crystal obtained be oriented <100>.

Recrystallization attempts have been made with continuously emitting lasers, but bearing in mind the size of the spots available with these sources and the problem of overlapping of melted lines, this solution would hardly appear to be suitable for large wafers (diameter 10 cm).

Another known solution consists of using a graphite plate heated by the Joule effect and a graphite rod also heated by the Joule effect, this rod being displaced on the surface of the semiconductor, where it melts a narrow silicon line. Such a procedure is described in the article of J. C. C. FAN, published in the journal "Applied Physics Letters", Vol. 40, No. 2, Jan. 15, 1982, p. 185.

The machine according to the invention also offers interesting possibilities in this field. Compared with the applicaton to annealing, however, it is necessary for an adaptation to be carried out. The defocused lamp 20 must heat the substrate to approximately 1100° C. and the focused lamp 10, 12 must be able to locally melt the silicon layer. Thus, the power ratings of these lamps are much higher than in the aforementioned application.

It is also possible to use as the second lamp placed beneath the wafer to be treated, a lamp irradiating substantially all of the surface. This result can be obtained by using a parabolic reflector, whose focal point is occupied by the lamp. In this arrangement, only the first lamp is displaced in order to obtain scanning on the wafer.

Moreover, it is known in crystallography that, during the pulling of a crystal, the melted area must have a concave front with respect to the recrystallized zone, in order to prevent nucleation on the edges. Thus, resolidification mainly takes place in the center of the melted zone, which makes it possible to pull long monocrystalline grains.

Figure 5:
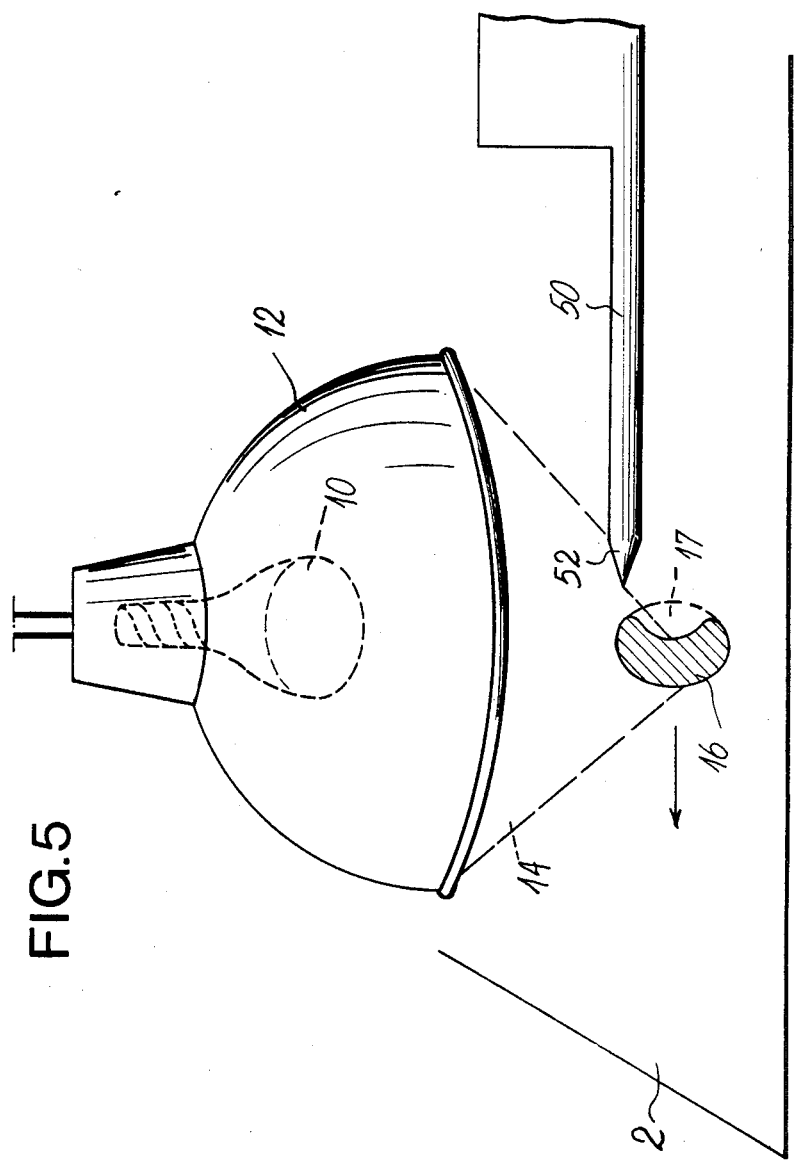
FIG. 5 shows a variant usable for the recrystallization of a semiconductor on an insulant.

This special configuration of the melted zone can be easily obtained by deforming the circular focal spot, in accordance with what is illustrated in FIG. 5. A rod 50, terminated by a platinum pin 52, is placed in the beam 14 emitted by the first lamp which is very close to the wafer. Pin 52 constitutes a mask, which casts a shadow on the wafer and makes it possible to obtain the desired kidney bean shape 16. It would naturally also be possible to use other means such as masks, relectors, etc., but the illustrated solution is particularly easy to realize.

Recrystallization tests have been carried out with the machine equipped in accordance with the diagram of FIG. 5, using the same lamps as for annealing. The melted zone was displaced with a velocity of 0.5 to 1 mm/s, in line by line scanning. Grains visible to the naked eye were obtained. These monocrystalline grains are oriented <100> in accordance with the normal to the plane of the wafer and <100> in the scanning direction. These crystallites have typical dimensions of 3 mm to several centimeters. The width is limited by the size of the spot obtained. These crystallites have slightly disoriented contiguous zones, with respect to <100> in the wafer plane. The angular distribution of the zones, separated by subboundaries, is less than 0.7° (typically 0.3°).

It should be noted that the width of the grains obtained (3 mm) is greater than that reported in the Fan article, where it is only 2 mm. Moreover, in the Fan article there is no question of a <100> texture in the recrystallized zone, whereas in the machine according to the invention a <100> monocrystal is obtained.

The aforementioned results are obtained with strips 1 cm wide and a few centimeters long. However, there is nothing to prevent the use of industrial circular wafers with a diameter of 10 cm. Line-by-line scanning must take place with a line overlap of approximately 10%, without remelting of the grains obtained in the preceding line.

It is naturally possible for all the operations described hereinbefore to be carried out with vertically positioned wafers or wafers in some other position, so that the words "above" or "below" have no limitative character and instead merely refer to the examples illustrated, where the wafer is horizontal. What is claimed is:

1. A heat treatment machine for heat treating a semiconductor wafer having first and second faces, comprising a first heating means arranged to locally heat a first spot on said first face of said wafer, a second heating means arranged to locally heat a second spot on said second face of said wafer, and means for displacing said first and second heating means such that said first spot scans the entire area of said first face, wherein said first spot forms a circle of first diameter and said second spot forms a circle of second diameter, said second diameter being greater than said first diameter and said first and second spots having a common center.

2. The heat treatment machine of claim 1, wherein said second spot covers the entire surface of said second face.

3. The heat treatment machine of claim 1, wherein said displacing means serves to displace the center of said first spot along an Archimedes spiral with respect to a center of said wafer in accordance with a relation $r = a\phi$, in which r and $\phi$ are polar coordinates with respect to an origin at a center of said wafer, a is a constant, and $\phi$ is equal to $b\sqrt{t}$, where b is a constant and t represents time, such that said first spot is displaced at a substantially constant velocity.

4. The heat treatment machine of claim 1, wherein said first heating means comprises a first lamp and a first focusing reflector, and said second heating means comprises a second lamp and a second focusing reflector.

5. The heat treatment machine of claim 4, wherein said second focusing reflector is arranged to focus radiation emitted by said second lamp in a plane which is displaced a predetermined distance below said second face of said wafer.

6. The heat treatment machine of claim 4, wherein said second spot covers almost the entire surface of said second face.

7. The heat treatment machine of claim 1, further comprising stationary means for supporting said wafer.

8. The heat treatment machine of claim 7, further comprising means defining a chamber for receiving said wafer, said chamber means being rigidly connected to said supporting means and having a gas supply duct and a gas discharge duct formed therein, said chamber means in turn comprising an insulating ring rigidly connected to said supporting means, a first transparent porthole arranged between said wafer and said first heating means, and a second transparent porthole arranged between said wafer and said second heating means.

9. The heat treatment machine of claim 1, further comprising means for giving said first spot a shape having a concave area.

10. The heat treatment machine of claim 9, wherein said means for giving said first spot a shape having a concave area comprise a rod terminated by a pin, said pin being placed in the path of radiation emitted by said first lamp so as to cast a shadow on said first spot, said shadow defining said concave area.

11. The heat-treatment machine of claim 10, wherein said pin is made of platinum.

* * * * *